US009288930B2

(12) United States Patent
Kim et al.

(10) Patent No.: US 9,288,930 B2
(45) Date of Patent: Mar. 15, 2016

(54) THERMAL ENERGY STORAGE WITH A PHASE-CHANGE MATERIAL IN A NON-METAL CONTAINER

(71) Applicants: Gerald Ho Kim, Carlsbad, CA (US); Jay Eunjae Kim, Issaquah, WA (US)

(72) Inventors: Gerald Ho Kim, Carlsbad, CA (US); Jay Eunjae Kim, Issaquah, WA (US)

( * ) Notice: Subject to any disclaimer, the term of this patent is extended or adjusted under 35 U.S.C. 154(b) by 255 days.

(21) Appl. No.: 13/890,202

(22) Filed: May 8, 2013

(65) Prior Publication Data

US 2013/0308279 A1  Nov. 21, 2013

Related U.S. Application Data

(60) Provisional application No. 61/647,392, filed on May 15, 2012, provisional application No. 61/649,261, filed on May 19, 2012.

(51) Int. Cl.
| H05K 7/20 | (2006.01) |
| H01L 23/34 | (2006.01) |
| H05K 1/00 | (2006.01) |
| H05K 1/02 | (2006.01) |
| H01L 23/373 | (2006.01) |
| H01L 23/427 | (2006.01) |

(52) U.S. Cl.
CPC ............ *H05K 7/2029* (2013.01); *H01L 23/373* (2013.01); *H01L 23/4275* (2013.01); *H05K 1/0203* (2013.01); *H01L 2924/0002* (2013.01)

(58) Field of Classification Search
CPC  H05K 7/2039; H01L 23/373; H01L 23/4275; H01L 2924/002; F28D 2020/0017
USPC ........................ 361/679.46–679.54, 688–723
See application file for complete search history.

(56) References Cited

U.S. PATENT DOCUMENTS

| 4,178,727 | A | * | 12/1979 | Prusinski et al. | ............ 52/173.3 |
| 4,579,170 | A | * | 4/1986 | Moses et al. | ............ 165/104.17 |
| 5,007,478 | A | * | 4/1991 | Sengupta | ............ 165/10 |
| 2007/0012429 | A1 | * | 1/2007 | Siu | ............ 165/104.33 |
| 2007/0145546 | A1 | * | 6/2007 | Lewis et al. | ............ 257/675 |
| 2010/0002392 | A1 | * | 1/2010 | Liu | ............ 361/699 |

* cited by examiner

*Primary Examiner* — Zachary M Pape
(74) *Attorney, Agent, or Firm* — Andy M. Han

(57) ABSTRACT

A thermal energy storage apparatus that absorbs thermal energy from a heat-generating device is described. In one aspect, the thermal energy storage apparatus comprises a non-metal container and a phase-change material. The non-metal container is configured to receive the heat-generating device thereon. The phase-change material is contained in the non-metal container and configured to absorb at least a portion of heat from the heat-generating device through the non-metal container.

9 Claims, 6 Drawing Sheets

THERMAL ENERGY STORAGE WITH A PHASE-CHANGE MATERIAL IN A NON-METAL CONTAINER

CROSS REFERENCE TO RELATED PATENT APPLICATIONS

The present applicant claims the priority benefit of U.S. Patent Application No. 61/647,392, filed May 15, 2012, and U.S. Patent Application No. 61/649,261, filed May 19, 2012. Disclosures of the aforementioned applications are hereby incorporated by reference in their entirety.

BACKGROUND

1. Technical Field

The present disclosure generally relates to the field of transfer of thermal energy and, more particularly, to the storage of thermal energy with a phase-change material in a non-metal container.

2. Description of the Related Art

Compact heat-generating devices, such as laser diodes, light-emitting diodes (LEDs), vertical-cavity surface emitting lasers (VCSELs), integrated circuits including microprocessors, microwave chips and the like, generate thermal energy, or heat, when in operation. Regardless of which type of heat-generating device the case may be, heat generated by a compact heat-generating device needs to be removed or dissipated from the compact heat-generating device in order to achieve optimum performance of the compact heat-generating device and keep its temperature within a safe operating range. With the form factor of compact heat-generating devices (e.g., sensors or ASIC drivers in a telecom router, cellular phone tower, data communications server or mainframe computers) and the applications they are implemented in becoming ever smaller (e.g., the processor in a smartphone, a tablet computer or a notebook computer) resulting in high heat density, it is imperative to effectively dissipate the high-density heat generated in an area of small footprint to ensure safe and optimum operation of compact heat-generating devices operating under such conditions.

Many metal-based water-cooled and air-cooled cooling packages have been developed for use in compact packages to dissipate heat generated by the various types of compact heat-generating devices mentioned above. For instance, heat exchangers and heat pipes made of a metallic material with high thermal conductivity, such as copper, silver, aluminum or iron, are commercially available. However, most metal-based heat exchangers and heat pipes experience issues of oxidation, corrosion and/or crystallization after long periods of operation. Such fouling factors significantly reduce the heat transfer efficiency of metal-based heat exchangers and heat pipes. Other problems associated with the use of metal-based cooling packages include, for example, issues with overall compactness of the package, corrosion of the metallic material in water-cooled applications, difficulty in manufacturing, and so on. With increasing demand for high power density in small form factor, there is a need for a compact cooling package for compact heat-generating devices with fewer or none of the aforementioned issues.

One issue with heat dissipation in portable/mobile applications is that, even when heat generated by a heat-generating device (e.g., the processor in a smartphone, a tablet computer or a notebook computer) is removed or otherwise transferred away from the heat-generating device, the heat more or less is transferred to other portions of the portable apparatus in which the heat-generating device resides. This may not be desirable especially in portable/mobile applications. For instance, at least a portion of the heat generated by a microprocessor in a notebook computer is transferred to the casing of the notebook computer (e.g., a portion of the computer's casing closest to the microprocessor) making the casing warm or even hot to touch. As another example, some notebook computers may have a cooling fan installed therein to promote heat transfer by convection to cool off the microprocessor of the notebook computer. Still, warm air can be felt near a vent of the casing where the cooling fan blows hot air out of the casing, and the casing of the notebook computer may still be warm or even hot to touch. Consequently, user experience of such portable/mobile apparatus may be negatively impacted if not rendered dangerous.

SUMMARY

Various embodiments of a thermal energy storage apparatus that absorbs thermal energy from a compact heat-generating device are provided.

According to one aspect, a thermal energy storage apparatus that absorbs and stores thermal energy from a heat-generating device may comprise a non-metal (e.g., silicon-based) container and a phase-change material. The non-metal container may be configured to receive the heat-generating device thereon. The phase-change material may be contained in the non-metal container and configured to absorb at least a portion of heat from the heat-generating device through the non-metal container.

In one embodiment, the non-metal container may comprise at least one component made of single-crystal silicon, polycrystal silicon, syntactic diamond, graphite, carbon-fiber, graphene, or carbon nanotubes.

In one embodiment, the phase-change material may comprise a salt hydrate, an ionic liquid, paraffin, fatty acid, ester, an organic-organic compound, an organic-inorganic compound, or an inorganic-inorganic compound.

In one embodiment, the non-metal container may comprise a non-metal first half piece and a non-metal second half piece. The non-metal first half piece may include a first primary side and a second primary side opposite to the first primary side. The first primary side of the first half piece may be configured to receive the heat-generating device thereon. The second primary side of the first half piece may include one or more recesses. The non-metal second half piece may include a first primary side and a second primary side opposite to the first primary side. The first primary side of the second half piece may be configured to receive a heat sink thereon. The second primary side of the second half piece may include one or more recesses. One or more voids, configured to contain the phase-change material therein, may be formed when the second primary side of the first half piece and the second primary side of the second half piece are mated together.

In one embodiment, the one or more voids may not be connected to each other.

In one embodiment, the phase-change material may be in liquid phase when filled into the non-metal container. The non-metal second half piece may include one or more openings each of which corresponding to a respective one of the one or more recesses on the second primary side of the second half piece such that the phase-change material is filled into the one or more voids through the one or more openings.

In one embodiment, the phase-change material may be in liquid phase when filled into the non-metal container. A first edge of the non-metal first half piece may include a recess and a first edge of the non-metal second half piece may include a recess such that when the non-metal first half piece and the non-metal second half piece are mated together the recess on the first edge of the non-metal first half piece and the recess on the first edge of the non-metal second half piece form on opening that allows the phase-change material to be filled into at least one of the one or more voids.

In one embodiment, the one or more recesses on the second primary side of the first half piece may surround a non-recessed portion of the second primary side of the first half piece. The one or more recesses on the second primary side of the second half piece may surround a non-recessed portion of the second primary side of the second half piece. When the second primary side of the first half piece and the second primary side of the second half piece are mated together the one or more voids may surround a non-void region.

In one embodiment, the non-void region may be sized and shaped approximately equal to or larger than a size and shape of the heat-generating device.

In one embodiment, the non-metal first half piece and the non-metal second half piece may be bonded together.

In one embodiment, the thermal energy storage apparatus may further comprise a heat sink and a layer of thermal interface material disposed between the non-metal container and the heat sink. In one embodiment, the heat sink may comprise metal or ceramic. In one embodiment, the layer of thermal interface material may comprise gold, tin, or a solder alloy.

In one embodiment, the thermal energy storage apparatus may further comprise the heat-generating device and a layer of thermal interface material disposed between the non-metal container and the heat-generating device. In one embodiment, the heat-generating device may comprise a laser diode, a vertical-cavity surface emitting laser (VCSEL), a light-emitting diode (LED), a light source, an integrated circuit (IC), or a microwave chip. In one embodiment, the layer of thermal interface material may comprise gold, tin, or a solder alloy.

In one embodiment, the thermal energy storage apparatus may further comprise a substrate and a layer of thermal interface material disposed between the non-metal container and the substrate. In one embodiment, the substrate may comprise a printed circuit board (PCB). In one embodiment, the layer of thermal interface material may comprise gold, tin, or a solder alloy.

In one embodiment, the thermal energy storage apparatus may further comprise a heat sink, disposed on the non-metal container or the substrate, and the heat-generating device, disposed on the non-metal container or the substrate.

In one embodiment, the thermal energy storage apparatus may further comprise a substrate having a first primary surface and a second primary surface opposite to the first primary surface. The substrate may include an opening configured to embed the non-metal container therein such that a primary surface of the non-metal container is exposed to receive the heat-generating device thereon.

In one embodiment, the substrate may comprise a printed circuit board (PCB).

According to another aspect, a portable electronics apparatus may comprise a thermal energy storage apparatus and an electronics device disposed on or inside the thermal energy storage apparatus such that at least a portion of thermal energy generated by the electronics device is transferred to and absorbed by the thermal energy storage apparatus. The thermal energy storage apparatus may comprise a non-metal container configured to receive the electronics device thereon or therein. The thermal energy storage apparatus may further comprise a phase-change material contained in the non-metal container and configured to absorb at least a portion of heat from the electronics device through the non-metal container. The electronics device may comprise a heat-generating device and a substrate on which the heat-generating device is disposed.

In one embodiment, the non-metal container may comprise at least one component made of single-crystal silicon, poly-crystal silicon, syntactic diamond, graphite, carbon-fiber, graphene, or carbon nanotubes.

In one embodiment, the phase-change material may comprise a salt hydrate, an ionic liquid, paraffin, fatty acid, ester, an organic-organic compound, an organic-inorganic compound, or an inorganic-inorganic compound.

In one embodiment, the non-metal container may comprise a non-metal first half piece and a non-metal second half piece. The non-metal first half piece may include a first primary side and a second primary side opposite to the first primary side. The first primary side of the first half piece may be configured to receive the heat-generating device thereon. The second primary side of the first half piece may include one or more recesses. The non-metal second half piece may include a first primary side and a second primary side opposite to the first primary side. The first primary side of the second half piece may be configured to receive a heat sink thereon. The second primary side of the second half piece may include one or more recesses. One or more voids, configured to contain the phase-change material therein, may be formed when the second primary side of the first half piece and the second primary side of the second half piece are mated together.

In one embodiment, the one or more voids may not be connected to each other.

In one embodiment, the phase-change material may be in liquid phase when filled into the non-metal container. The non-metal second half piece may include one or more openings each of which corresponding to a respective one of the one or more recesses on the second primary side of the second half piece such that the phase-change material is filled into the one or more voids through the one or more openings.

In one embodiment, the phase-change material may be in liquid phase when filled into the non-metal container. A first edge of the non-metal first half piece may include a recess and a first edge of the non-metal second half piece includes a recess such that when the non-metal first half piece and the non-metal second half piece are mated together the recess on the first edge of the non-metal first half piece and the recess on the first edge of the non-metal second half piece form on opening that allows the phase-change material to be filled into at least one of the one or more voids.

In one embodiment, the one or more recesses on the second primary side of the first half piece may surround a non-recessed portion of the second primary side of the first half piece. The one or more recesses on the second primary side of the second half piece may surround a non-recessed portion of the second primary side of the second half piece. When the second primary side of the first half piece and the second primary side of the second half piece are mated together the one or more voids may surround a non-void region that is sized and shaped approximately equal to or larger than a size and shape of the heat-generating device.

In one embodiment, the non-metal first half piece and the non-metal second half piece may be bonded together.

In one embodiment, the heat-generating device may comprise a processor.

In one embodiment, the substrate may comprise a printed circuit board (PCB).

This summary is provided to introduce concepts relating to a thermal energy storage apparatus that absorbs thermal energy from a compact heat-generating device. Some embodiments of the thermal energy storage apparatus are further described below in the detailed description. This summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

The present disclosure describes embodiments of a thermal energy storage apparatus that absorbs thermal energy from a heat-generating device is described. The disclosed thermal energy storage apparatus is capable of absorbing and storing thermal energy generated by the heat-generating device. More specifically, at least to a certain extent, the disclosed thermal energy storage apparatus is capable of absorbing and storing thermal energy as latent heat in that the thermal energy storage apparatus absorbs and stores the thermal energy without a change in temperature. This feature advantageously allows thermal energy to be transferred from the heat-generating device, thereby optimizing the performance and useful life of the heat-generating device, while providing enhanced user experience in that the portable/mobile apparatus in which the heat-generating device resides is not warm or hot to touch. When the heat-generating device is not in operation or is in a low-power mode, e.g., sleep mode or standby mode during which the heat-generating device is generating little or no heat, thermal energy stored in the thermal energy storage apparatus may be slowly released out of the thermal energy storage apparatus and to a heat sink, in addition to or including the casing of the portable/mobile apparatus. As thermal energy is slowly released from the thermal energy storage apparatus to the heat sink and eventually to the casing of the portable/mobile apparatus, the portable/mobile apparatus is barely warm to touch, if at all.

As silicon is inert, the non-metal container, when made of silicon for example, is not subject to issues related to oxidation, corrosion and/or crystallization after long periods of operation. Silicon also has high Young's modulus and is elastic enough to withstand the thermal expansion of the phase-change material contained therein. Additionally, silicon has a relatively high thermal conductivity, making it an ideal choice of material for the container that contains the phase-change material therein.

Illustrative Embodiments

Figure 1:
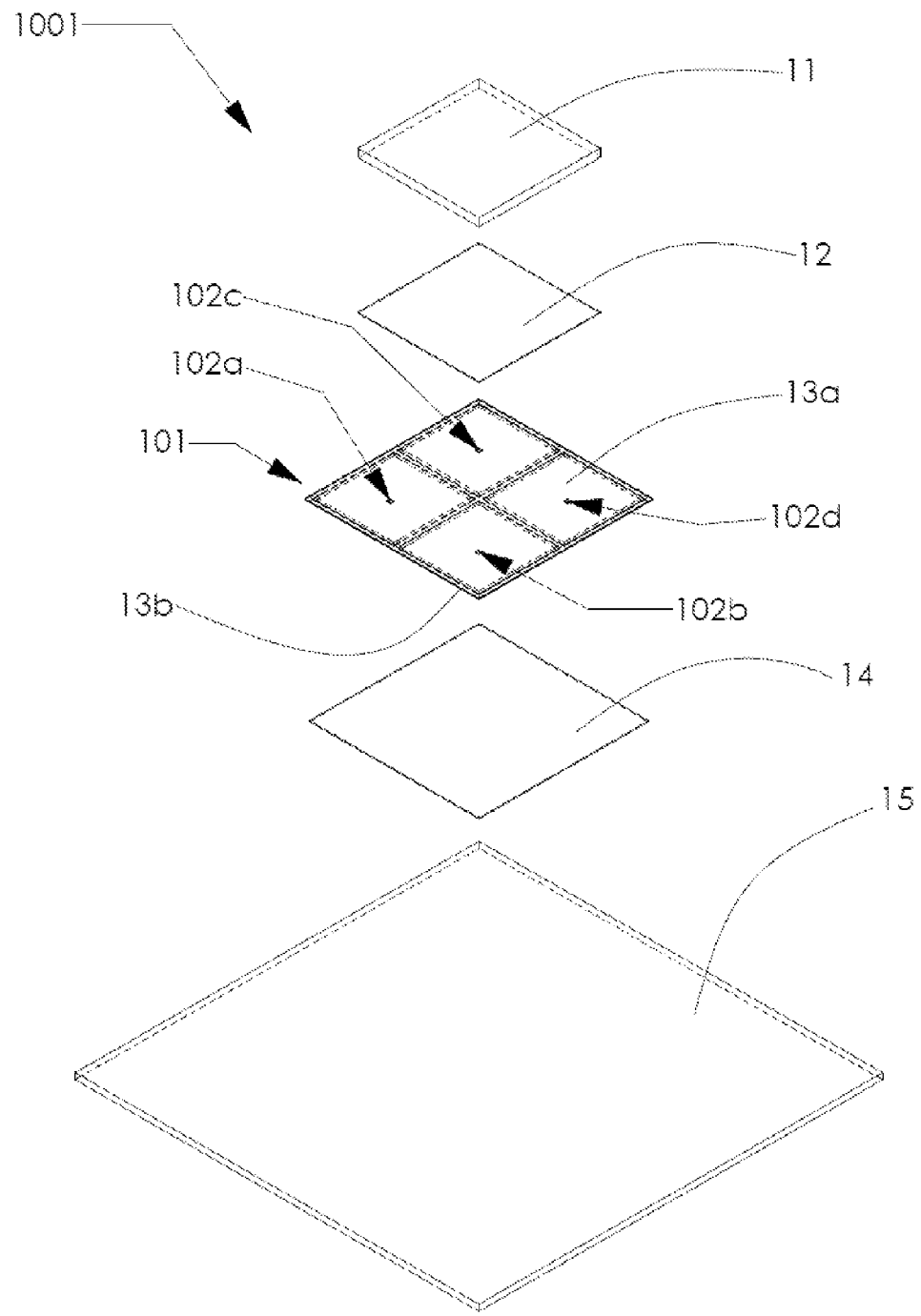
FIG. 1 is an exploded view of a thermal energy management arrangement including a non-metal thermal energy storage device in accordance with an embodiment of the present disclosure.
Figure 2:
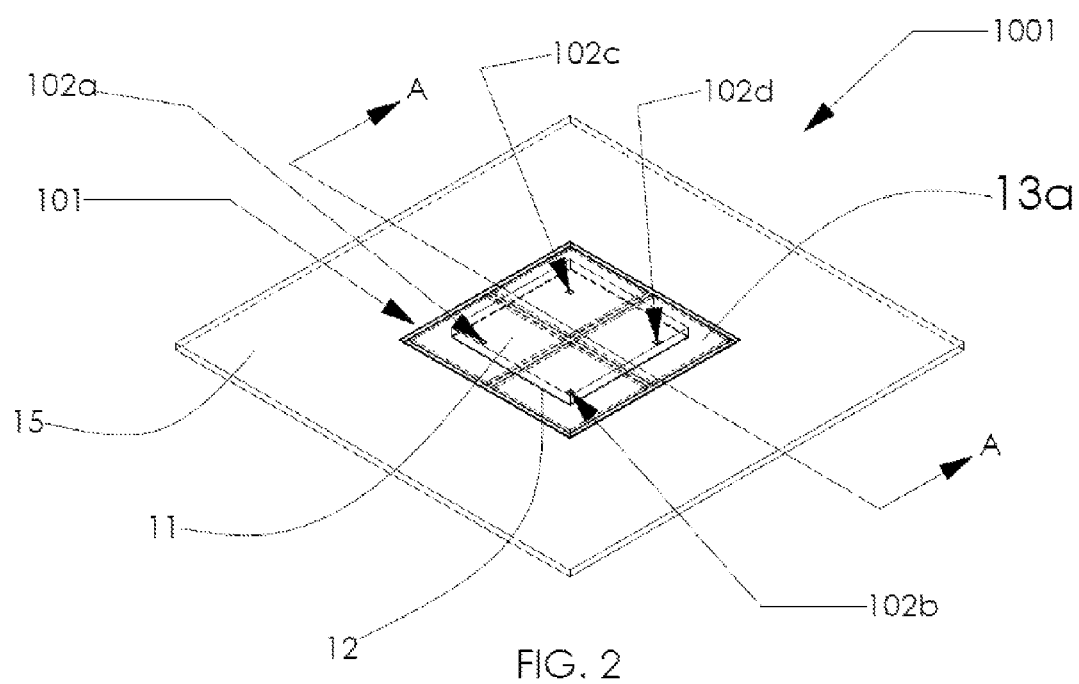
FIG. 2 is a perspective view of the thermal energy management arrangement of FIG. 1 in accordance with an embodiment of the present disclosure.
Figure 3:
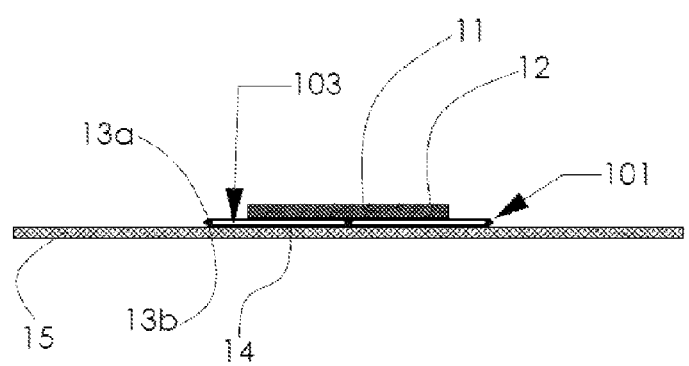
FIG. 3 is a side view of the thermal energy management arrangement of FIG. 1 in accordance with an embodiment of the present disclosure.
Figure 4:
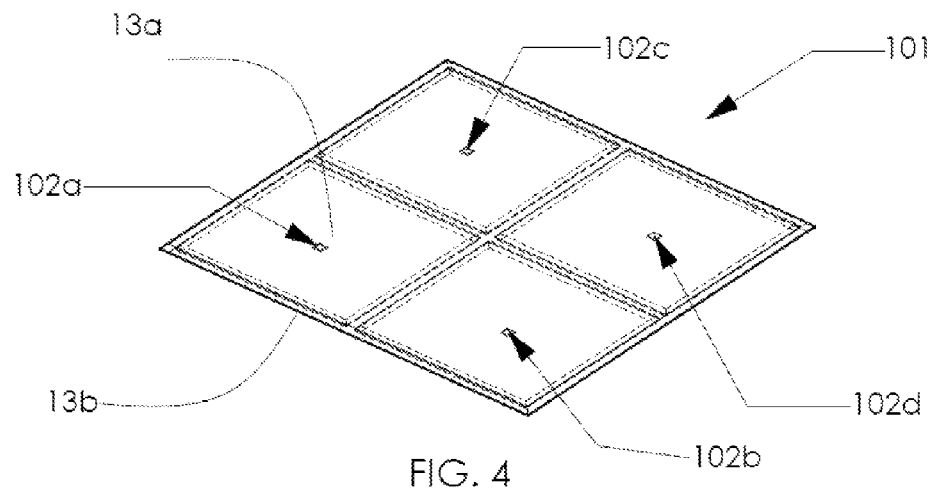
FIG. 4 is a perspective view of the non-metal thermal energy storage device of FIG. 1 in accordance with an embodiment of the present disclosure.
Figure 5:
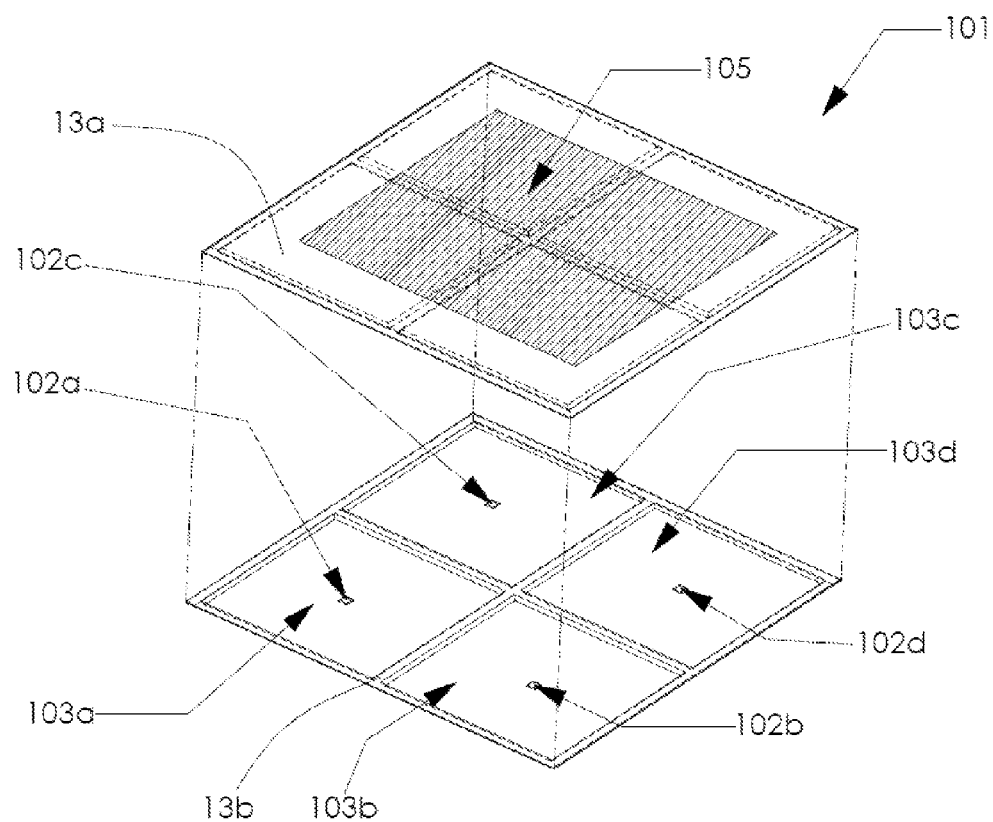
FIG. 5 is an exploded view of the non-metal thermal energy storage device of FIG. 4 in accordance with an embodiment of the present disclosure.
Figure 6:
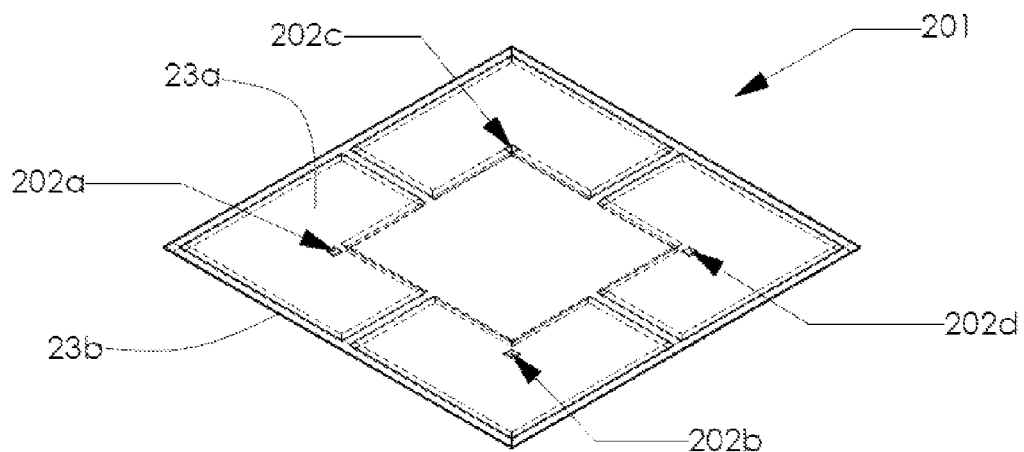
FIG. 6 is a perspective view of a non-metal thermal energy storage device in accordance with another embodiment of the present disclosure.
Figure 7:
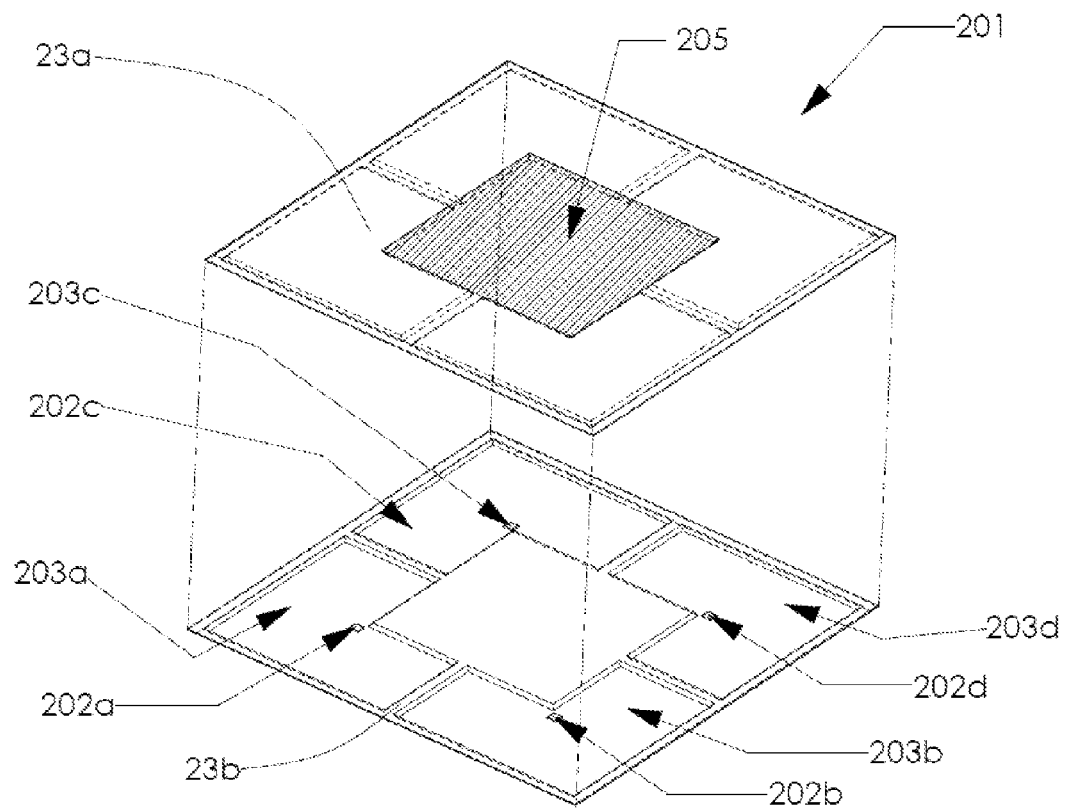
FIG. 7 is an exploded view of the non-metal thermal energy storage device of FIG. 6 in accordance with an embodiment of the present disclosure.

FIGS. 1-3 illustrate various views of a thermal energy management arrangement 1001 including a non-metal thermal energy storage device 101 in accordance with an embodiment of the present disclosure. FIGS. 4-5 illustrate various views of one embodiment of the non-metal thermal energy storage device 101. FIGS. 6-7 illustrate various views of one embodiment of a non-metal thermal energy storage device 201.

As shown in FIG. 1-3, a thermal energy storage apparatus that absorbs and stores thermal energy from a heat-generating device 11 may comprise a non-metal thermal energy storage device that includes a non-metal container 101 and a phase-change material (not shown). The non-metal container 101 may be configured to receive the heat-generating device 11 thereon. For example, as shown in FIGS. 1-7, a top surface of the non-metal container 101 or 201 may be configured to receive the heat-generating device 11 thereon. The phase-change material is contained in the non-metal container 101 or 201 and configured to absorb at least a portion of heat from the heat-generating device 11 through the non-metal container 101 or 201.

In one embodiment, the phase-change material may comprise a salt hydrate, an ionic liquid, paraffin, fatty acid, ester, an organic-organic compound, an organic-inorganic compound, an inorganic-inorganic compound, or any to-be-developed material suitable for the intended purpose as described in the present disclosure.

In one embodiment, the non-metal container 101 or 201 may comprise a non-metal first half piece 13a or 23a and a non-metal second half piece 13b or 23b. At least one of the non-metal first half piece 13a or 23a and the non-metal second half piece 13b or 23b is made of single-crystal silicon, poly-crystal silicon, syntactic diamond, graphite, carbon-fiber, graphene, or carbon nanotubes. The non-metal first half piece 13a or 23a may include a first primary side and a second primary side opposite to the first primary side. The first primary side of the first half piece 13a or 23a may be configured to receive the heat-generating device 11 thereon. The second primary side of the first half piece 13a or 23a may include one or more recesses.

In the example shown in FIGS. 1-7, the second primary side of the first half piece 13a or 23a includes four recesses. The non-metal second half piece 13b or 23b may include a first primary side and a second primary side opposite to the first primary side. The first primary side of the second half piece 13b or 23b may be configured to receive a heat sink 15 thereon. The second primary side of the second half piece 13b or 23b may include one or more recesses. In the example shown in FIGS. 1-7, the second primary side of the second half piece 13b or 23b includes four recesses. One or more voids, configured to contain the phase-change material therein, are formed when the second primary side of the first half piece 13a or 23a and the second primary side of the second half piece 13b or 23b are mated together. As shown in FIGS. 1-7, four voids 103a, 103b, 103c, 103d or 203a, 203b, 203c, 203d are formed when the second primary side of the first half piece 13a or 23a and the second primary side of the second half piece 13b or 23b are mated together. The voids 103a, 103b, 103c, 103d or 203a, 203b, 203c, 203d hold or otherwise contain the phase-change material therein.

In one embodiment, the one or more voids 103a, 103b, 103c, 103d or 203a, 203b, 203c, 203d may not be connected to each other. As shown in FIGS. 4 - 7, the voids 103a, 103b, 103c, 103d or 203a, 203b, 203c, 203d are not connected to each other as every two of the voids 103a, 103b, 103c, 103d or 203a, 203b, 203c, 203d are separated by a partition therebetween.

In one embodiment, the phase-change material may be in liquid phase when filled into the non-metal container 101 or 201. The non-metal second half piece 13b may include one or more small openings (openings 102a, 102b, 102c, 102d for non-metal container 101 and openings 202a, 202b, 202c, 202d for non-metal container 201) each of which corresponding to a respective one of the one or more recesses on the second primary side of the second half piece 13b or 23b such that the phase-change material is filled into the one or more voids 103a, 103b, 103c, 103d or 203a, 203b, 203c, 203d through the one or more openings 102a, 102b, 102c and 102d or 202a, 202b, 202c and 202d. The one or more openings 102a, 102b, 102c and 102d or 202a, 202b, 202c and 202d may be plugged up after the phase-change material is filled into the one or more voids 103a, 103b, 103c, 103d or 203a, 203b, 203c, 203d.

Alternatively, a first edge of the non-metal first half piece 13a or 23a may include a recess and a first edge of the non-metal second half piece 13b or 23b may include a recess such that, when the non-metal first half piece 13a or 23a and the non-metal second half piece 13b or 23b are mated together, the recess on the first edge of the non-metal first half piece 13a or 23a and the recess on the first edge of the non-metal second half piece 13b or 23b form on opening that allows the phase-change material to be filled into at least one of the one or more voids 103a, 103b, 103c, 103d or 203a, 203b, 203c, 203d of the non-metal container 101 or 201.

In one embodiment as shown in FIGS. 6-7, the one or more recesses on the second primary side of the first half piece 23a may surround a non-recessed portion of the second primary side of the first half piece 23a. The one or more recesses on the second primary side of the second half piece 23b may surround a non-recessed portion of the second primary side of the second half piece 23b. When the second primary side of the first half piece 23a and the second primary side of the second half piece 23b are mated together the one or more voids 203a, 203b, 203c, 203d may surround a non-void region. In one embodiment, the non-void region may be sized and shaped approximately equal to or larger than a size and shape of the heat-generating device. For example, as shown in FIGS. 6-7, the non-void region may be sized and shaped such that, when the heat-generating device 11 is received on the first primary side of the first half piece 23a, the heat-generating device 11 is directly above the non-void region of the non-metal container 201. This allows thermal energy in the heat-generating device 11 to be transferred to the non-void region of the non-metal container 201 and then to the phase-change material contained in the voids 203a, 203b, 203c, 203d surrounding the non-void region of the non-metal container 201.

In one embodiment, the non-metal first half piece 13a or 23a and the non-metal second half piece 13b or 23b may be bonded together.

In one embodiment, the thermal energy storage apparatus may further comprise the heat sink 15 and a layer of thermal interface material 14 disposed between the non-metal container 101 or 201 and the heat sink 15. In one embodiment, the heat sink 15 may comprise metal or ceramic. In one embodiment, the layer of thermal interface material 14 may comprise gold, tin, or a solder alloy.

In one embodiment, the thermal energy storage apparatus may further comprise the heat-generating device 11 and a layer of thermal interface material 12 disposed between the non-metal container 101 or 201 and the heat-generating device 11. In one embodiment, the heat-generating device 11 may comprise a laser diode, a VCSEL, an LED, a light source, an IC such as a microprocessor, microwave chip, communication chip, RF chip or the like. In one embodiment, the layer of thermal interface material 12 may comprise gold, tin, or a solder alloy.

Figure 8:
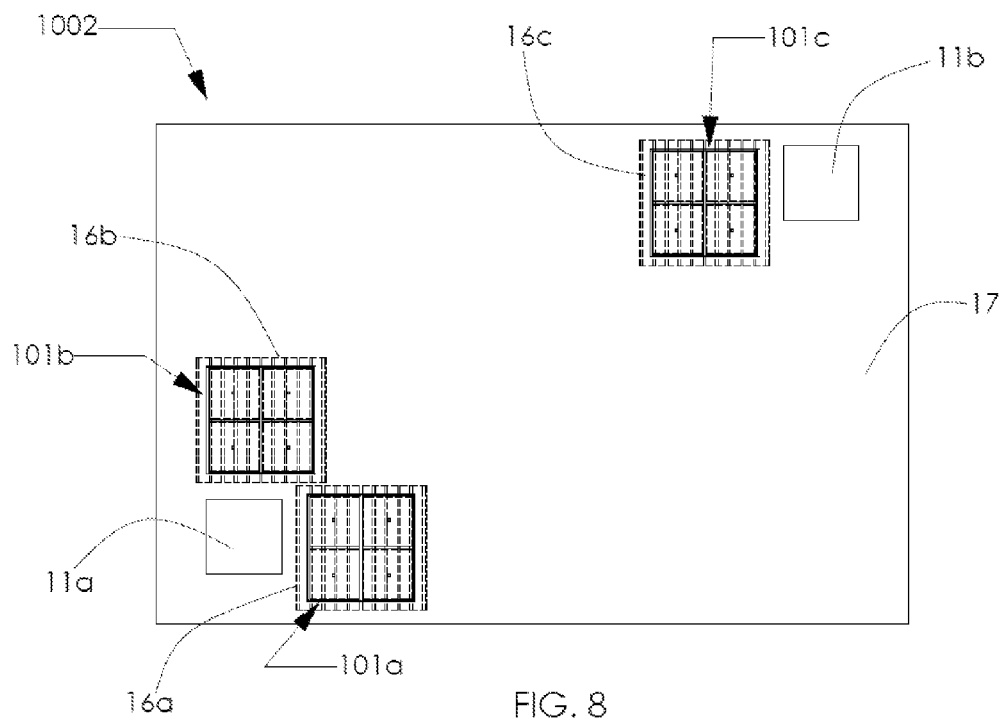
FIG. 8 is a top view of another thermal energy management arrangement including one or more non-metal thermal energy storage devices in accordance with an embodiment of the present disclosure.
Figure 9:
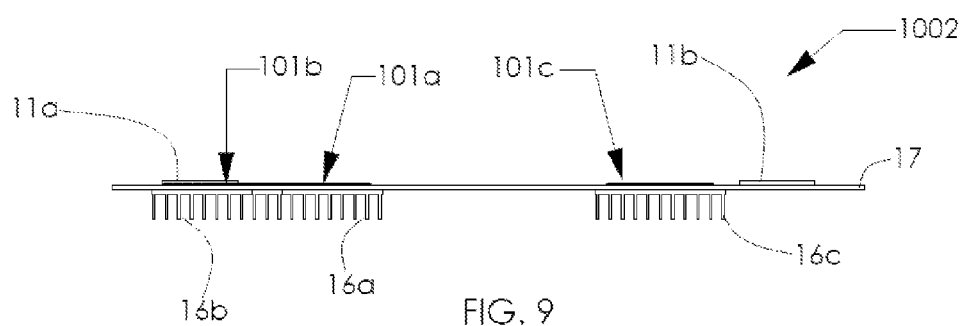
FIG. 9 is a side view of the thermal energy management arrangement of FIG. 8 in accordance with an embodiment of the present disclosure.
Figure 10:
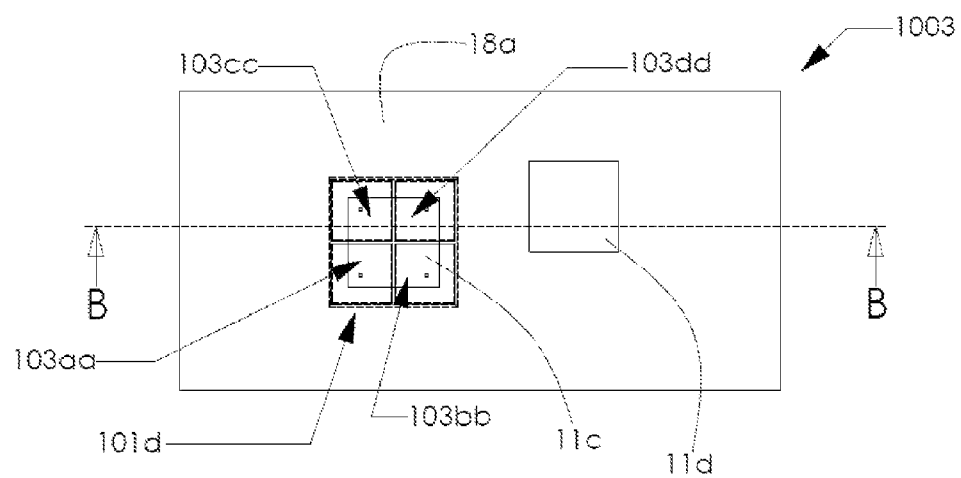
FIG. 10 is a top view of yet another thermal energy management arrangement including one or more non-metal thermal energy storage devices in accordance with an embodiment of the present disclosure.
Figure 11:
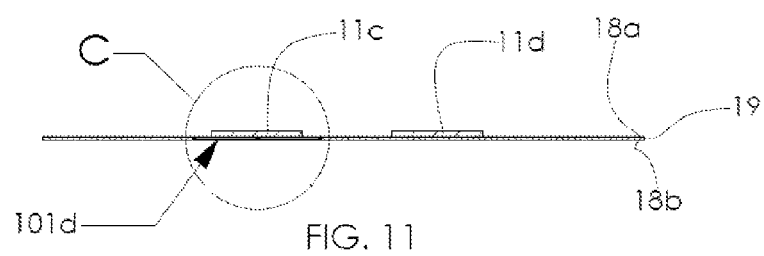
FIG. 11 is a side view of the thermal energy management arrangement of FIG. 10 in accordance with an embodiment of the present disclosure.
Figure 12:
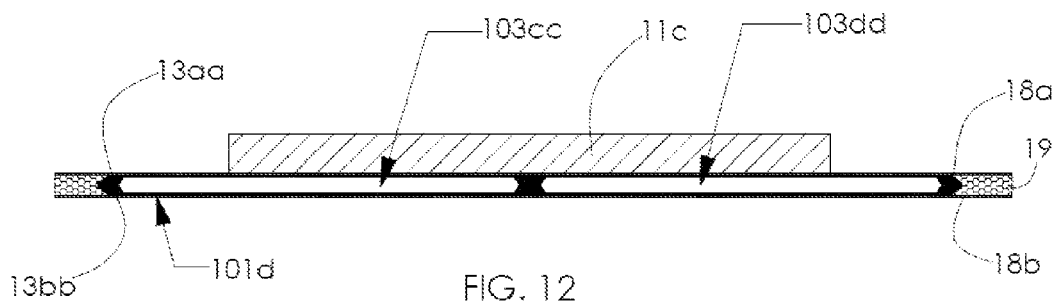
FIG. 12 is an enlarged side view of a portion of the thermal energy management arrangement of FIG. 10 in accordance with an embodiment of the present disclosure.

FIGS. 8-9 illustrate various views of another thermal energy management arrangement 1002 including one or more non-metal thermal energy storage devices 101 or 201 in accordance with an embodiment of the present disclosure. FIGS. 10-12 illustrate various views of still another thermal energy management arrangement 1003 including one or more non-metal thermal energy storage devices 101 or 201 in accordance with an embodiment of the present disclosure.

In one embodiment, a thermal energy storage apparatus may comprise one or more non-metal thermal energy storage devices 101a, 101b, 101c each of which includes a non-metal container 101 or 201, a phase-change material (not shown) contained in each of one or more non-metal container 101a, 101b, 101c, 101d and a substrate 17 or 19. In some embodiments, the thermal energy storage apparatus may further comprise a layer of thermal interface material disposed between each of the one or more non-metal containers 101a, 101b, 101c and the substrate 17. In one embodiment, the substrate 17 may comprise a printed circuit board (PCB). In one embodiment, the layer of thermal interface material may comprise gold, tin, or a solder alloy.

Referring to FIGS. 8-9, the thermal energy storage apparatus may further comprise one or more heat sinks 16a, 16b, 16c, each disposed on a respective one of the one or more non-metal containers 101a, 101b, 101c. Alternatively, the one or more heat sinks 16a, 16b, 16c may be disposed on the substrate 17, on a side of the substrate 17 that is opposite to a side of the substrate 17 on which the one or more non-metal containers 101a, 101b, 101c are disposed, as shown in FIGS. 8-9. In one embodiment, the thermal energy storage apparatus may further comprise one or more heat-generating devices 11a, 11b, disposed on the one or more non-metal containers 101a, 101b, 101c or on the substrate 17.

Referring to FIGS. 10-12, the substrate 19 has a first primary surface 18a and a second primary surface 18b opposite to the first primary surface 18a. The substrate 19 may include an opening configured to embed the non-metal container 101d therein such that a first primary surface 13aa of the non-metal container 101d is exposed to receive the heat-generating device 11c thereon. The non-metal container 101d may have one or more voids 103aa, 103bb, 103cc, 103dd that contain the phase-change material therein. The first primary surface 13aa of the non-metal container 101d may be flush with the first primary surface 18a of the substrate 19, and a second primary surface 13bb of the non-metal container 101d that is opposite to the first primary surface 13bb may be flush with the second primary surface 18b of the substrate 19. As shown in FIGS. 10-12, the heat-generating device 11c may be disposed on the non-metal container 101d such that thermal energy can be directly absorbed by the non-metal container 101d and the phase-change material contained therein via conduction.

In one embodiment, the substrate 19 may comprise a PCB.

Exemplary Portable Electronics Apparatus

The above-described thermal energy storage apparatus may be used in a portable electronics apparatus for thermal energy storage and management. For example, the above-described thermal energy storage apparatus may be used in a portable electronics apparatus such as a tablet computer (e.g., iPad by Apple of Cupertino, Calif.), hand-held mobile communication device (e.g., iPhone by Apple of Cupertino, Calif.), notebook/laptop computer, or any suitable hand-held portable device.

Accordingly, a portable electronics apparatus may comprise a thermal energy storage apparatus and an electronics device disposed on or inside the thermal energy storage apparatus such that at least a portion of thermal energy generated by the electronics device is transferred to and absorbed by the thermal energy storage apparatus. The thermal energy storage apparatus may comprise a non-metal (e.g., silicon-based) container configured to receive the electronics device thereon or therein. The thermal energy storage apparatus may further comprise a phase-change material contained in the non-metal container and configured to absorb at least a portion of heat from the electronics device through the non-metal container. The electronics device may comprise a heat-generating device and a substrate on which the heat-generating device is disposed.

In one embodiment, the non-metal container may comprise at least one component made of single-crystal silicon, poly-crystal silicon, syntactic diamond, graphite, carbon-fiber, graphene, or carbon nanotubes.

In one embodiment, the phase-change material may comprise a salt hydrate, an ionic liquid, paraffin, fatty acid, ester, an organic-organic compound, an organic-inorganic compound, or an inorganic-inorganic compound.

In one embodiment, the non-metal container may comprise a non-metal first half piece and a non-metal second half piece. The non-metal first half piece may include a first primary side and a second primary side opposite to the first primary side. The first primary side of the first half piece may be configured to receive the heat-generating device thereon. The second primary side of the first half piece may include one or more recesses. The non-metal second half piece may include a first primary side and a second primary side opposite to the first primary side. The first primary side of the second half piece may be configured to receive a heat sink thereon. The second primary side of the second half piece may include one or more recesses. One or more voids, configured to contain the phase-change material therein, may be formed when the second primary side of the first half piece and the second primary side of the second half piece are mated together.

In one embodiment, the one or more voids may not be connected to each other.

In one embodiment, the phase-change material may be in liquid phase when filled into the non-metal container. The non-metal second half piece may include one or more openings each of which corresponding to a respective one of the one or more recesses on the second primary side of the second half piece such that the phase-change material is filled into the one or more voids through the one or more openings.

In one embodiment, the phase-change material may be in liquid phase when filled into the non-metal container. A first edge of the non-metal first half piece may include a recess and a first edge of the non-metal second half piece includes a recess such that when the non-metal first half piece and the non-metal second half piece are mated together the recess on the first edge of the non-metal first half piece and the recess on the first edge of the non-metal second half piece form on opening that allows the phase-change material to be filled into at least one of the one or more voids.

In one embodiment, the one or more recesses on the second primary side of the first half piece may surround a non-recessed portion of the second primary side of the first half piece. The one or more recesses on the second primary side of the second half piece may surround a non-recessed portion of the second primary side of the second half piece. When the second primary side of the first half piece and the second primary side of the second half piece are mated together the one or more voids may surround a non-void region that is sized and shaped approximately equal to or larger than a size and shape of the heat-generating device.

In one embodiment, the non-metal first half piece and the non-metal second half piece may be bonded together.

In one embodiment, the heat-generating device may comprise a processor.

In one embodiment, the substrate may comprise a PCB.

Conclusion

The above-described techniques pertain to thermal energy storage with a phase-change material contained in a non-metal container. Although the techniques have been described in language specific to certain applications, it is to be understood that the appended claims are not necessarily limited to the specific features or applications described herein. Rather, the specific features and applications are disclosed as exemplary forms of implementing such techniques.

What is claimed is:

1. A thermal energy storage apparatus that absorbs thermal energy from a heat-generating device, the thermal energy storage apparatus comprising:
   a non-metal container configured to receive the heat-generating device thereon;
   a phase-change material contained in the non-metal container and configured to absorb at least a portion of heat from the heat-generating device through the non-metal container; and
   a substrate having a first primary surface and a second primary surface opposite to the first primary surface, the substrate including an opening configured to embed the non-metal container therein such that a primary surface of the non-metal container is exposed to receive the heat-generating device thereon.

2. The thermal energy storage apparatus as recited in claim 1, wherein the non-metal container comprises at least one component made of single-crystal silicon, poly-crystal silicon, syntactic diamond, graphite, carbon-fiber, graphene, or carbon nanotubes.

3. The thermal energy storage apparatus as recited in claim 1, wherein the phase-change material comprises a salt hydrate, an ionic liquid, paraffin, fatty acid, ester, an organic-organic compound, an organic-inorganic compound, or an inorganic-inorganic compound.

4. The thermal energy storage apparatus as recited in claim 1, wherein the non-metal container comprises:
   a non-metal first half piece having a first primary side and a second primary side opposite to the first primary side, wherein:
      the first primary side of the first half piece is configured to receive the heat-generating device thereon, and
      the second primary side of the first half piece includes one or more recesses; and
   a non-metal second half piece having a first primary side and a second primary side opposite to the first primary side, wherein:
      the first primary side of the second half piece is configured to receive a heat sink thereon, and
      the second primary side of the second half piece includes one or more recesses such that one or more voids, configured to contain the phase-change material therein, are formed when the second primary side of the first half piece and the second primary side of the second half piece are mated together.

5. The thermal energy storage apparatus as recited in claim 4, wherein the one or more voids are not connected to each other.

6. The thermal energy storage apparatus as recited in claim 4, wherein the phase-change material is in liquid phase when filled into the non-metal container, and wherein the non-metal second half piece includes one or more openings each of which corresponding to a respective one of the one or more recesses on the second primary side of the second half piece such that the phase-change material is filled into the one or more voids through the one or more openings.

7. The thermal energy storage apparatus as recited in claim 4, wherein the one or more recesses on the second primary side of the first half piece surround a non-recessed portion of the second primary side of the first half piece, wherein the one or more recesses on the second primary side of the second half piece surround a non-recessed portion of the second primary side of the second half piece, and wherein when the second primary side of the first half piece and the second primary side of the second half piece are mated together the one or more voids surround a non-void region that is sized and shaped approximately equal to or larger than a size and shape of the heat-generating device.

8. The thermal energy storage apparatus as recited in claim 4, wherein the non-metal first half piece and the non-metal second half piece are bonded together.

9. The thermal energy storage apparatus as recited in claim 1, wherein the substrate comprises a printed circuit board (PCB).

\* \* \* \* \*